United States Patent
Collin et al.

(10) Patent No.: US 6,874,134 B1
(45) Date of Patent: Mar. 29, 2005

(54) CONVERSION OF AN HDL SEQUENTIAL TRUTH TABLE TO GENERIC HDL ELEMENTS

(76) Inventors: Jerome Collin, 790 Outremont Avenue, Apt 7, Outremont, QC H2V 3N4 (CA); Reily M. Jacoby, 49 Andersen Dr., Boxford, MA (US) 01921; Abelardo Pardo, Universidad Carlos III de Madrid, Avenida Universidad 30, E-28911 Leganes, Madrid (ES)

(*) Notice: Subject to any disclaimer, the term of this patent is extended or adjusted under 35 U.S.C. 154(b) by 435 days.

(21) Appl. No.: 09/731,535

(22) Filed: Dec. 6, 2000

(51) Int. Cl.[7] .............................................. G06F 17/50
(52) U.S. Cl. ................................................ 716/3; 716/4
(58) Field of Search ........................................ 716/3, 4

(56) References Cited

U.S. PATENT DOCUMENTS

| | | | | |
|---|---|---|---|---|
| 5,537,580 A | * | 7/1996 | Giomi et al. ................. 716/19 |
| 5,572,437 A | * | 11/1996 | Rostoker et al. ............... 716/18 |
| 5,680,332 A | * | 10/1997 | Raimi et al. ................... 703/13 |
| 6,148,436 A | * | 11/2000 | Wohl ............................ 716/18 |
| 6,182,268 B1 | * | 1/2001 | McElvain ....................... 716/1 |
| 6,247,165 B1 | | 6/2001 | Wohl et al. | |

* cited by examiner

Primary Examiner—A. M. Thompson
(74) Attorney, Agent, or Firm—Klarquist Sparkman, LLP

(57) ABSTRACT

An HDL conversion process receives a data structure representing the behavior of a circuit element. The circuit element is sequential and the data structure is defined in a hardware description language (HDL) using a specific format. The conversion process generates a conversion matrix from the data structure. The conversion matrix represents the behavior of the circuit element in a generic format. The conversion process then determines a generic HDL register and a plurality of generic HDL input logic for the generic HDL register to replicate the behavior represented by the data structure based on the conversion matrix.

43 Claims, 14 Drawing Sheets

FIG. 1

```
PRIMITIVE SIMPLE_DFF ( Q, D, CLK, SET );
    OUTPUT Q;
    INPUT  D , CLK, SET;
    REG    Q;

// POSITIVE EDGE TRIGGERED D FLIP-FLOP WITH ACTIVE HIGH
// ASYNCHRONOUS SET

TABLE
//  D     CLK    SET    Q       Q+

1     (01)   0   :  ?   :   1;  // LINE 1: CLOCKED DATA
    0     (01)   0   :  ?   :   0;  // LINE 2: CLOCKED DATA

?      ?     *   :  ?   :   1;  // LINE 3: IGNORE: PESSIMISM

?      ?     1   :  ?   :   1;  // LINE 4: ASYNCHRONOUS SET

?     (?0)   ?   :  ?   :   -;  // LINE 5: IGNORE FALLING CLOCK

*      1     ?   :  ?   :   -;  // LINE 6: IGNORE DATA EDGES
    *      0     ?   :  ?   :   -;  // LINE 7: IGNORE DATA EDGES

ENDTABLE
ENDPRIMITIVE
```

| I-,Q \ I,Q+ | 0001 | 0011 | 0101 | 0111 | 1001 | 1011 | 1101 | 1111 |
|---|---|---|---|---|---|---|---|---|
| 0001 | R |   | L |   | E |   |   |   |
| 0011 | R | E |   |   | L | L |   |   |
| 0101 | R | E |   |   | L |   | E |   |
| 0111 | R |   | L | E |   |   |   | L |
| 1001 | R | E |   |   |   |   | L | E |
| 1011 | R |   | L |   | E |   |   | L |
| 1101 | R |   |   | E | E |   |   | L |
| 1111 | R |   |   |   | L |   | L | E |

FIG. 8

| SET, Q \ D, CLK | 00 | 11 | 11 | 10 |
|---|---|---|---|---|
| 00 | 0 | 0 | 0 | 0 |
| 01 | DC | 0 | DC | DC |
| 11 | DC | DC | DC | DC |
| 10 | 1 | 1 | 1 | 1 |

|  SET,Q \ D | 0 | 1 |
|---|---|---|
| 00 | 0 | 1 |
| 01 | 0 | 1 |
| 11 | DC | 1 |
| 10 | DC | DC |

US 6,874,134 B1

CONVERSION OF AN HDL SEQUENTIAL TRUTH TABLE TO GENERIC HDL ELEMENTS

FIELD OF THE INVENTION

The present invention pertains to the field of electronic design automation. More particularly, this invention relates to converting hardware description language (HDL) sequential truth tables to generic HDL elements.

BACKGROUND

Electronic design automation (EDA) includes a wide variety of tools used to create integrated circuits. Hardware description languages (HDLs) are one such tool. Verilog and Very High Speed Integrated Circuit (VHSIC) Hardware Description Language (VHDL) are two common examples of HDLs. HDLs often resemble programming languages and can be used to describe integrated circuits in a written format. A written HDL description can be used by various other EDA tools to simulate an integrated circuit, synthesize a different kind of representation of an integrated circuit, fabricate a physical integrated circuit, check the equivalency of two integrated circuits, modify an integrated circuit design for various purposes such as testability, and the like.

Integrated circuit fabricators often provide one or more HDL libraries that describe the various physical integrated circuits that the fabricator can fabricate. A library is often "technology specific" in that it describes a set of circuit elements that can be fabricated by the fabricator using a particular fabrication technology. A designer can design an integrated circuit using HDL elements from one or more libraries and then the fabricator who provided the libraries can automatically create an equivalent physical circuit based on the HDL design.

When the fabricator creates a library, the fabricator can use a wide variety of "shortcuts" to describe the HDL elements. That is, since the fabricator is going to fabricate a circuit based on an HDL description written using his or her own library of HDL elements, the fabrication process can be "tuned" to recognize particular HDL elements that correspond to particular blocks of physical circuit elements. In other words, a number of physical circuit elements may routinely be fabricated as a block in a physical circuit so, rather than individually describing each physical element in generic HDL elements, the fabricator can combine the description of the physical circuit elements into a single technology-specific HDL element.

Basically, a technology-specific HDL element is one type of "truth table" commonly used in HDL descriptions. A truth table has a number of input and output signals and defines a specific behavior in response to various input and output values. A truth table, however, generally provides no insight into the physical make-up of the circuit elements being represented. Truth tables can be created in various HDLs for a variety of purposes in addition to streamlining technology-specific libraries. One common example of an HDL truth table is a Verilog user defined primitive (UDP).

During the design process, a designer may want to use a variety of EDA tools to simulate, verify, and/or modify the design. Many EDA tools use generic algorithms that have been created to operate on generic HDL descriptions. For instance, Verilog includes pre-defined "primitive" elements. Virtually any EDA tool that supports Verilog can operate on a Verilog description written using these pre-defined primitives. HDL descriptions that include non-generic elements, such as technology-specific elements or other kinds of HDL truth tables, tend to create problems for certain generic algorithms. For instance, operating on an HDL element at the truth table level may provide insufficient detail. An algorithm may need to delve into the elements making up a truth table in order to provide meaningful information.

BRIEF DESCRIPTION OF THE DRAWINGS

Examples of the present invention are illustrated in the accompanying drawings. The accompanying drawings, however, do not limit the scope of the present invention. Similar references in the drawings indicate similar elements.

FIG. 1 illustrates one embodiment of a Verilog UDP.

FIG. 6 illustrates one output state transition region in more detail.

FIG. 7 illustrates one embodiment of a simplified transition region.

FIG. 8 illustrates a Karnaugh map for a particular set function, Fset.

DETAILED DESCRIPTION

Figure 2:
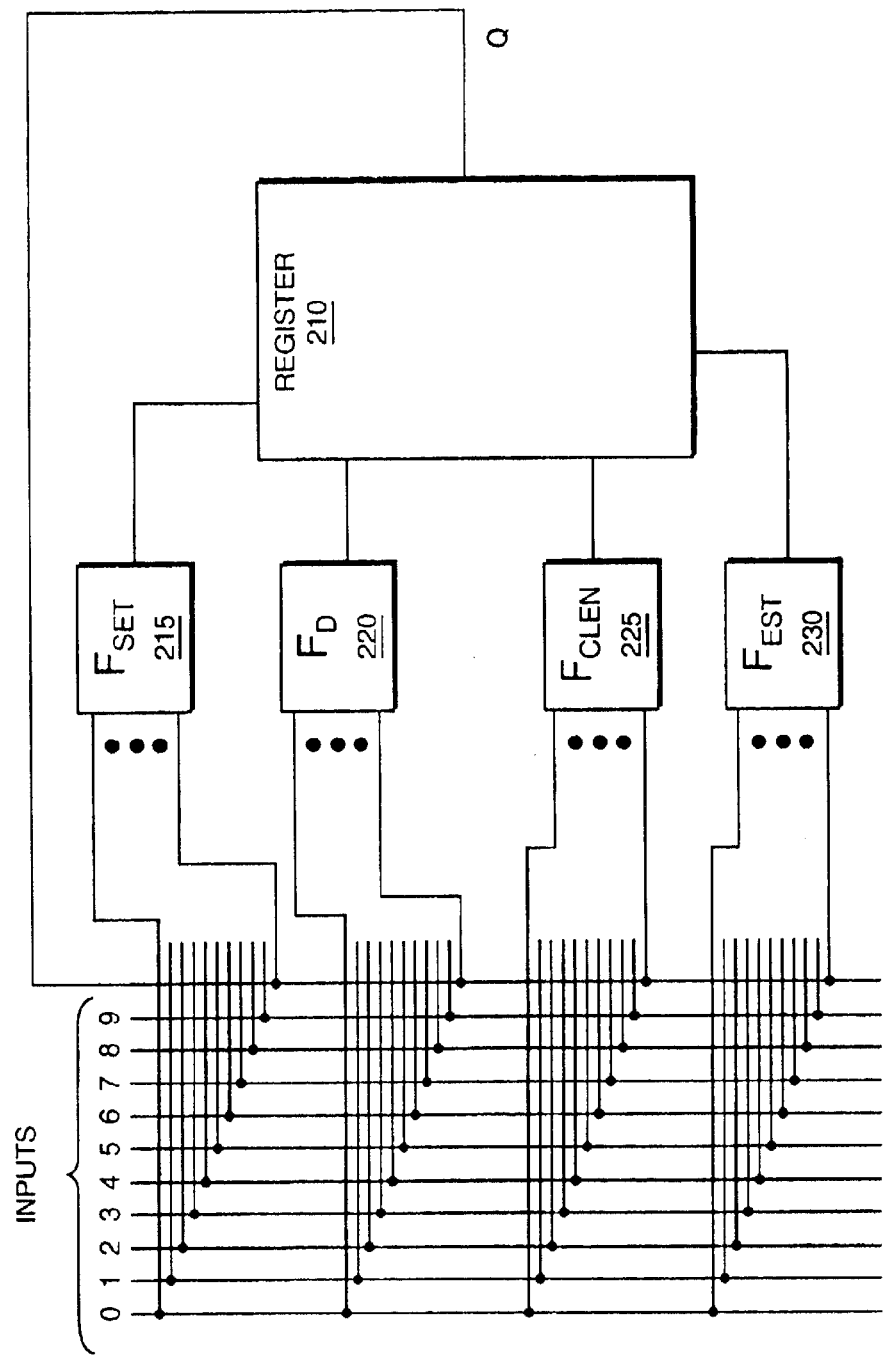
FIG. 2 illustrates one embodiment of a generic register and generic combinational logic functions equivalent to an HDL sequential truth table.

In the following detailed description, numerous specific details are set forth in order to provide a thorough understanding of the present invention. However, those skilled in the art will understand that the present invention may be practiced without these specific details, that the present invention is not limited to the depicted embodiments, and that the present invention may be practiced in a variety of alternate embodiments. In other instances, well known methods, procedures, components, and circuits have not been described in detail.

Parts of the description will be presented using terminology commonly employed by those skilled in the art to convey the substance of their work to others skilled in the art. Also, parts of the description will be presented in terms of operations performed through the execution of programming instructions. As well understood by those skilled in the art, these operations often take the form of electrical, magnetic, or optical signals capable of being stored, transferred, combined, and otherwise manipulated through, for instance, electrical components.

Various operations will be described as multiple discrete steps performed in turn in a manner that is helpful in understanding the present invention. However, the order of description should not be construed as to imply that these operations are necessarily performed in the order they are presented, or even order dependent. Lastly, repeated usage of the phrase "in one embodiment" does not necessarily refer to the same embodiment, although it may.

The present invention converts a hardware description language (HDL) "truth table" into generic HDL elements. Converting a truth table representing purely combinational logic to generic HDL elements is generally fairly straight forward. A truth table for combinational logic defines an output for each possible input combination. The truth table for purely combinational logic is comparatively trivial because the next output does not depend on the current output. A variety of logic minimization techniques can be applied to such a truth table to find a combination of generic logic elements that represent the behavior.

Sequential truth tables are more challenging. The next output of a sequential truth table may depend on the current input, the current output, and the next input. A particular set of inputs and a corresponding output at a given instant in time define a "state" of the truth table. A state transition for a sequential truth table is a transition from a current state to a next state. The behavior of a sequential device usually cannot be represented in a standard truth table. Therefore, common logic minimization techniques cannot be used to find a combination of generic logic elements to represent the sequential behavior.

In general, the present invention generates a conversion matrix from a data structure representing the behavior of a sequential HDL truth table. The conversion matrix represents the behavior of the HDL truth table in a generic format. Based on the generic conversion matrix, the present invention is able to determine a combination of a generic HDL register and various input logic functions to replicate the behavior of the sequential truth table. As used herein, "register" generally refers to either an edge sensitive or level sensitive sequential device.

Sequential HDL truth tables can be written in a variety of ways to represent the behavior of a sequential device. For example, FIG. 1 illustrates one embodiment of a Verilog user defined primitive (UDP) that defines the behavior of a simple sequential truth table. The word "primitive" indicates that the HDL element is a UDP. The word "simple_dff" is a user-defined name assigned to the UDP.

The UDP defines one output, Q, and three inputs, D, CLK, and SET. The word "reg" indicates that the UDP is a register, which is a sequential device, and that the register stores the output value Q. The text following "//" marks are merely comments optionally added to the UDP to assist a human reader to understand the operation of the truth table. The comments have nothing whatsoever to do with the functionality of the UDP and would be entirely ignored by any EDA tool.

By definition, the first three columns of the table correspond to the three inputs in the order in which the inputs are listed in the port list in parenthesis. The Q column defines the current value of Q stored in the register. The Q+ column defines the next value of Q based on the corresponding set of inputs and the current value of Q and it is always the first port in the port list. "Short cuts" are used in the table to condense the representation of the behavior of the UDP. For instance, "?" represents any of three possible states, 0, 1, or X, where X represents an unknown state of either 0 or 1. "(01)" indicates an edge transition from 0 to 1. "*" represents any transition, such as 0 to 1, 0 to X, 1 to 0, 1 to X, X to 0, or X to 1. "–" indicates no change. For instance, in lines 5, 6, and 7 of the table, the next output Q+ is equal to the last output Q.

A human reading this simple UDP may be able to discern from the comments and the table that it represents a D Flip-Flop. A D Flip-Flop is an edge triggered register. That is, when operating in a synchronous mode, the next output Q+ transitions to whatever value is on the data input D in response to an edge transition on the clock input CLK. In the illustrated embodiment, the D Flip-Flop is positive edge triggered, as shown by lines 1 and 2 of the table, because the next output Q+ equals the value at the data input D in response to a positive edge from 0 to 1 on the clock input CLK. Conversely, on a negative or falling edge, the next output Q+ remains unchanged, as shown in line 5 of the table. The D Flip-Flop is in synchronous mode when the SET input is inactive, or 0 in the illustrated embodiment. In asynchronous mode, where SET is active, the next output Q+ goes to 1 without regard to edge transitions on the CLK input, as illustrated by line 4 in the table.

Alternate embodiments may also include a RESET input that, when active, forces the next output Q+ to 0. An alternate UDP may represent a level sensitive register, or latch. Rather than a CLK input, a latch has an enable input EN. A latch is level sensitive in that the next output Q+ follows the input D whenever the EN input is active. A latch can be active high, where EN is 1, or active low, where EN is 0. A latch can similarly have asynchronous inputs like SET and RESET to force the next output Q+ to 1 or 0, respectively.

Although a human may be able to discern the functionality of a simple UDP table, like the D Flip-Flop illustrated in FIG. 1, a Verilog UDP can be much more complex than the illustrated example. For instance, a UDP can have up to ten input signals and may be either edge triggered or level sensitive. For instance, as illustrated in FIG. 2, the behavior defined by a UDP may represent a combination of a sequential register 210 and a number of combinational logic functions, Fset 215, Fd 220, Fclen 225, and Frst 230, associated with each input on the register 210. Inputs 0 through 9 may be provided to one or more of the combinational logic functions. The Q output may also be considered as an input for the next clock cycle. For instance, the data function, Fd 220, may be equivalent to a number of logic gates, multiplexers, or the like, that combine up to 10 of the inputs and/or the Q output. Similarly, each of the other logic functions, Fset 215, Fclen 225, and Frst 230, may combine up to ten of the inputs and/or the Q output. In which case, it can be very difficult, if not impossible, for a human to determine the set of elements 210 through 230 that equivalently represent the behavior of a complex UDP.

Moreover, with all the possible short cuts available for writing UDPs, devising an automated algorithm that can determine the set of elements 210 through 230 that equivalently represent the behavior of even a simple UDP can be very difficult. That is, two different users may write a UDP that represents the same behavior in totally different ways. The difficulty arises in recognizing in a UDP table all the possible syntax variations and state combinations that define a particular behavior. Lines in a table can be combined or expanded in a number of ways. Tables may include lines of information that will not be useful to find the combinational logic functions but can be useful in other contexts.

In fact, because Verilog is event driven, there is no easy way to recognize whether the register 210 should be an edge triggered or a level sensitive register based on a UDP table. That is, any time an event occurs, such as a change at one of the inputs or the output, the UDP table is evaluated to determine the next state. Nothing happens unless there is an event. In which case, each state transition can be, and often is, represented in a UDP table as an edge event, even if the register being described is really a level sensitive register.

In other words, UDPs can be written with so much variation and with so many idiosyncrasies, converting UDPs to generic representations is no trivial matter. The present invention, however, does just that. The present invention converts a sequential HDL truth table, such as a sequential Verilog UDP, into combinational gates, such as AND, OR, NOT, etc., and a register element. For instance, the present invention can determine which register primitive, either an edge sensitive D Flip-Flop having inputs for set, reset, clock, and data, or a level sensitive latch having inputs for set, reset, enable, and data, to use for register 210. Furthermore, the present invention can determine what combinational logic primitives to use for each of the input functions 215 to 230 to provide behavior equivalent to that defined by the UDP. The generic HOL can then be used, for instance, by any of a variety of HDL tools, such as an equivalency checker, design for test tool, etc.

In the description below, the present invention will be described with reference to Verilog UDPs. Those skilled in the art will recognize that the present invention can similarly be applied to any of a variety of HDL truth tables capable of describing sequential behavior.

Figure 3:
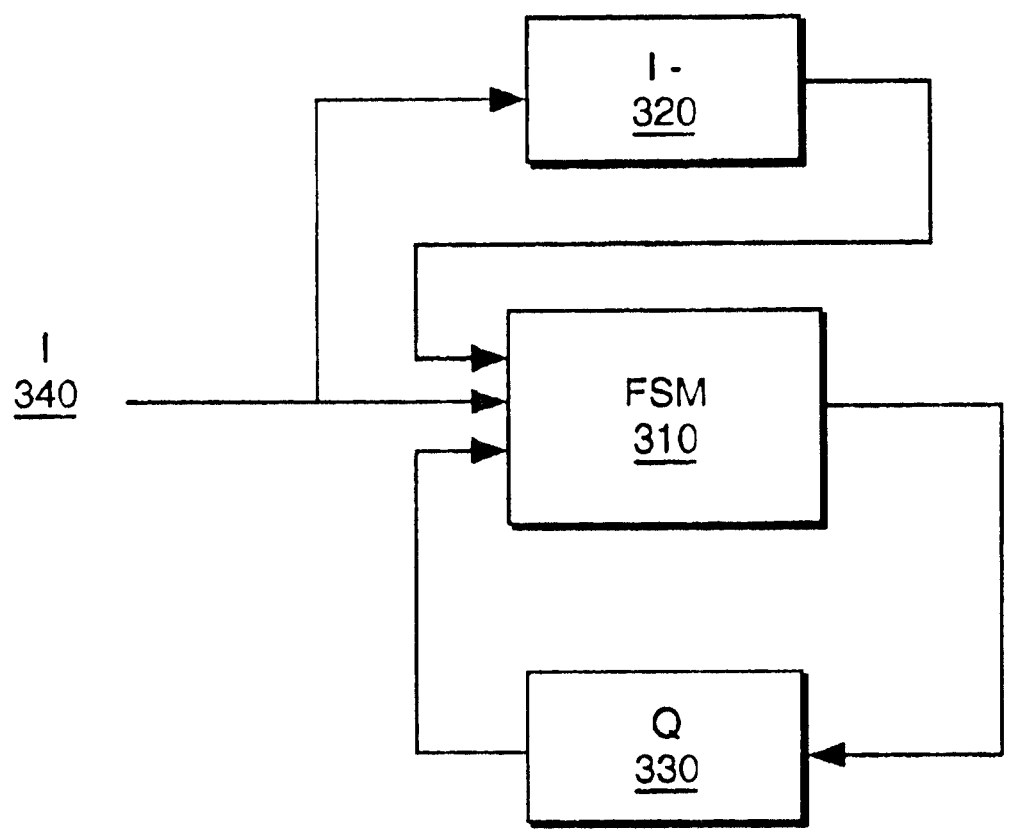
FIG. 3 illustrates one embodiment of a finite state machine to evaluate all the possible states of an HDL sequential truth table.

The present invention begins by generating a conversion matrix based on the UDP table. The conversion matrix represents the behavior of the circuit element in generic form. For instance, as shown in FIG. 3, the behavior of the UDP can be specified in terms of a finite state machine (FSM) 310. The FSM 310 evaluates the UDP table based on the current input values I-320, the current output value Q 330, and the next input value I 340. The conversion matrix is populated by evaluating the FSM for every possible state transition.

Figure 4:
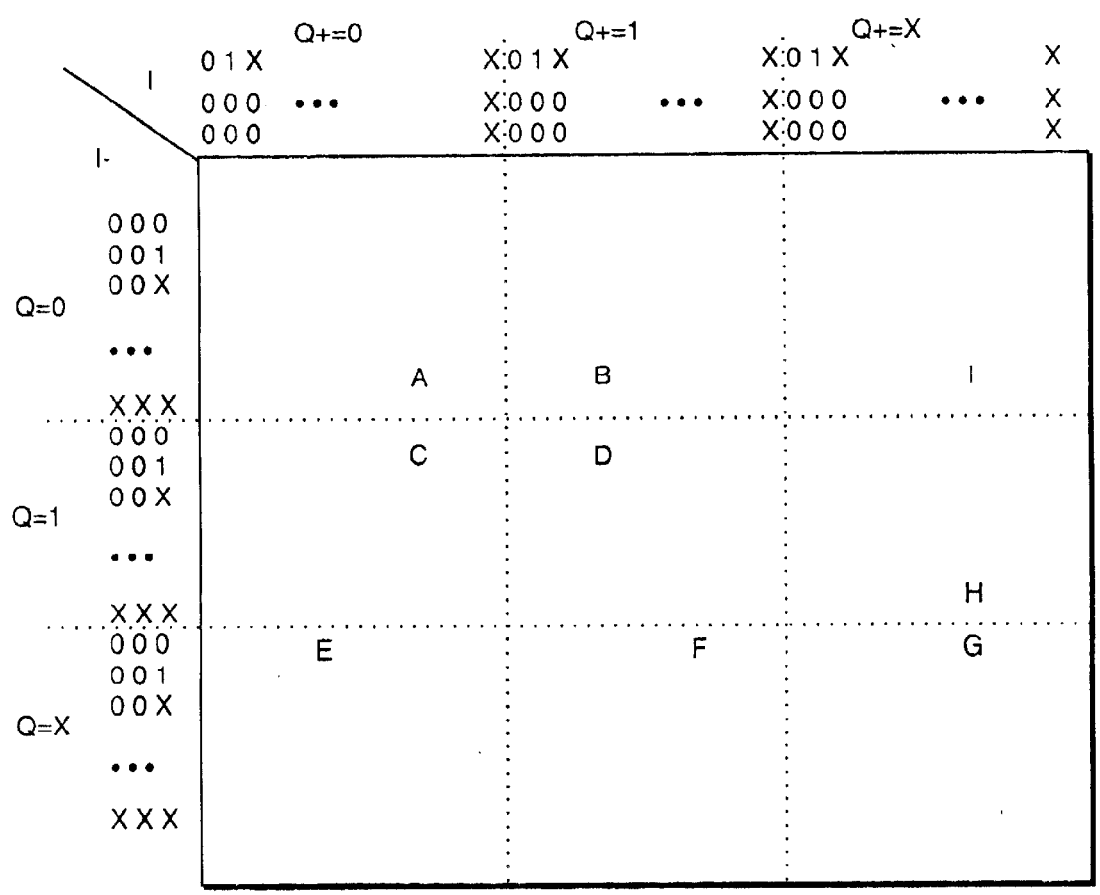
FIG. 4 illustrates one embodiment of a conversion matrix.

FIG. 4 illustrates one embodiment of a conversion matrix. Each row in the conversion matrix corresponds to a current state of the FSM. A separate row is included for every possible current state of the UDP. That is, there is a row for every possible combination of input and output values. For instance, if the UDP has N inputs and one output, and each input can be 0, 1, or X, there are $3^{N+1}$ rows in the conversion matrix. Similarly, each column corresponds to a next state of the UDP. A separate column is included for every possible next state of the UDP, for a total of $3^{N+1}$ columns.

An entry in the conversion matrix is added for each state transition evaluated by the FSM 310. For instance, for a given row, any one of the N input bits could transition to one of two values. For instance, an input value of 0 could transition to 1 or X. In which case, each row may have up to 2N occupied entries, each occupied entry corresponding to a particular next state column.

For a given column, any one of the N input bits or the output bit may have transitioned to reach the corresponding next state. Each of the input bits may have transitioned from one of two states. For instance, an input bit may have transitioned its from 0 to X or 1 to X. So, there are 2N possible input combinations. For each of those 2N possible input combinations, the output state may have transitioned from one of two possible states, or the output state may have stayed the same. For instance, the transition Q to Q+ (written QQ+) may have been 1 to 0 or X to 0, or the output bit may have stayed the same, 0 to 0. In which case, for each of the 2N possible input transition combinations, there are three possible output bit transitions, for a total of 6N possible occupied entries corresponding to each next state column.

The conversion matrix can be divided into nine regions, A through G in FIG. 4, corresponding to each of the nine possible output state transitions QQ+. That is, in region A, the current output state is Q=0 and the next output state Q+=0. As discussed below, the nine regions can be used to provide some insight into the determination of Verilog primitives to represent the UDP.

Basically the conversion matrix expands the UDP table out to every possible single bit transition. Since every possible single bit transition is represented in the conversion matrix, the conversion matrix provides an exact representation of the behavior of the UDP. That is, no matter how the UDP table is written, every behaviorally equivalent representation of a UDP table will result in the same conversion matrix.

For instance, referring back to FIG. 1, the UDP table defines N=3 inputs and one output. Expanding the UDP out to a conversion matrix will result in a $3^4$ by $3^4$ (81 by 81) conversion matrix. For example, line 1 of the UDP table can be expanded out to three lines in the UDP table for the three possible values represented by "?" in the Q column. The state of line 1 for D, CLK, SET, and Q can be written as a set of four bits. For instance, the current state for line 1 of D =1, CLK=0, SET=0, and Q=? could be written as 100?. Expanding the question mark out, the three lines would be 1001, 1000, and 100X. Each line is an "edge" line in that an edge transition is defined in the line for the CLK input to transition from 0 to 1, called a rising or positive edge. In which case, the next states for each respective line in the table would be 1101. Since each line in the table defines one particular state transition, the conversion matrix has three entries, one at the intersection of current state row 1001 and next state column 1101, row 1000 and column 1101, and row 100X and column 1101.

Similarly, every line in the UDP table having a "?" is expanded out. Taking line 4 as an example, line 4 has three "?'s" in the current state, ??1?. In which case, line 4 is expanded out to $3^3$, or 27, lines. Furthermore, each of the 27 expanded lines are "level" lines. Unlike an edge line as described above, a level line does not define any particular state transition but rather a group of transitions. In which case, a next state from a level line could be a transition of any one of the N input bits. Since each of the N input bits can transition to one of two possible states, each level line in a UDP table can define 2N possible state transitions. In the UDP table of FIG. 1, there are N=3 inputs, so each level line corresponds to 6 state transitions. Therefore, each of the 27 level lines expanded out from line 4 in the UDP table will result in 6 entries in the conversion matrix, for a total of 6 times 27, or 162, entries. That is, the single line 4 in the simple UDP table of FIG. 1 corresponds to 162 state transition entries in the conversion matrix.

In alternate embodiments, the conversion matrix may not include columns for all the possible next states. For instance, not all of the possible next states will be reachable. That is, when the UDP table is evaluated, some next states will simply never occur. In which case, some columns would not have occupied entries associated with them so that those columns could be excluded from the matrix without sacrificing a complete representation of the behavior of the UDP.

Figure 5A:
FIGS. 5A and 5B illustrate one embodiment of a particular conversion matrix for a given Verilog UDP.
Figure 5B:
Figure 5B:

FIGS. 5A and 5B illustrate one example of a conversion matrix for the UDP table of FIG. 1. The illustrated embodiment includes 81 rows for all possible current states but only 57 of the 81 possible next states because not all 81 possible next states need to be included to fully represent the behavior of the UDP. That is, as discussed above, some of the next states are unreachable and would not have occupied entries associated with them if they were included in the conversion matrix. As discussed below, reachability also provides insight into determination of Verilog primitives.

Multiple approaches can be used to analyze reachability. For instance, in one embodiment, a UDP initially has an unknown state which corresponds to all X's in the conversion matrix. Starting from an unknown state, the UDP table can be evaluated for each possible single bit state transition. Each of the resulting next states can be marked as reachable and, for each of the newly marked states, the UDP table can be evaluated for each possible one bit state transition to find the next set of reachable states. For each new reachable state, the process can be repeated until every reachable state is marked. For instance, in FIGS. 5A and 5B, each row is marked with an "R" for reachable or a "U" for unreachable.

Entries in the conversion matrix of FIGS. 5A and 5B are marked with an "E" for entries corresponding to an edge line, like line 1 in the UDP of FIG. 1. For instance, line 1 corresponds to three "E" entries in the conversion matrix. Entries marked with an "L" correspond to a level line, like line 4 in the UDP of FIG. 1. For instance, line 4 corresponds to 162 "L" entries. Entries marked with an "A" correspond to lines added to a UDP table. For instance, a UDP table may not define an output for every possible input state. In which case, by default in Verilog, the output state goes to X when an input state is undefined in the UDP table. Since the conversion matrix fully defines every state, entries may be added for these types of default states. Whether an entry is from a level line, an edge line, or an added line is generally irrelevant, although it may add some helpful information in certain circumstances. In alternate embodiments, entries can be marked in any number of ways and the origin of an entry need not be recorded in every embodiment.

Once the generic conversion matrix is generated, it fully defines the behavior of the UDP, but it says very little about what type of register and logic functions can be used to represent the same behavior. The present invention evaluates the conversion matrix to identify various behavioral characteristics. Experience has shown that by classifying the columns into particular categories, or sets, the sets can be used to determine whether the UDP represents an edge triggered register or a level sensitive register, and sets of columns can be combined in various ways to determine combinational logic functions, Fset, Fd, Fclen, and Frst, for the various register inputs.

In one embodiment, the sets of columns are based on three criteria. First, the columns are classified as either edge (E) or level (L) columns. Second, the columns are classified as reachable or unreachable (UR). Third, the columns are classified into six output state transitions QQ+ of 00, 01, 0X, 10, 11, and 1X. Experience has shown that output state transitions QQ+ of X0, X1, and XX generally do not provide any needed additional information, and are therefore usually not used to classify columns.

Using the three criteria, columns are classified into 24 sets. There are six level sets that are reachable (L00, L01, L0X, L10, L11, L1X). There are six edge sets that are reachable (E00, E01, E0X, E10, E11, E1X). There are six level sets that are unreachable (LUR00, LUR01, LUR0X, LUR10, LUR11, LUR1X). And, there are six edge sets that are unreachable (EUR00, EUR01, EUR 0X, EUR10, EUR11, EUR1X).

Each output state transition corresponds to one of the nine regions A through G mentioned above with respect to FIG. 4. Since output state transitions from X are usually ignored, regions E, F, and G usually are not used. However, by breaking up the conversion matrix into the six remaining regions, each region can be used to simplify identification of level columns, edge columns, unreachable level columns, and unreachable edge column.

Classifying columns into the 24 sets is essentially the reverse of the process used to create the conversion matrix. That is, the behavior of the UDP is converted from the specific, condensed format of the UDP table into the generic, fully expanded format of the conversion matrix, and then converted again into a second condensed format. UDPs that have different representations in the first condensed format, but identical functionality, will all have identical representations in the second condensed format. From the generic, condensed format, Verilog primitives can be identified to represent the behavior of the UDP.

Figure 6:
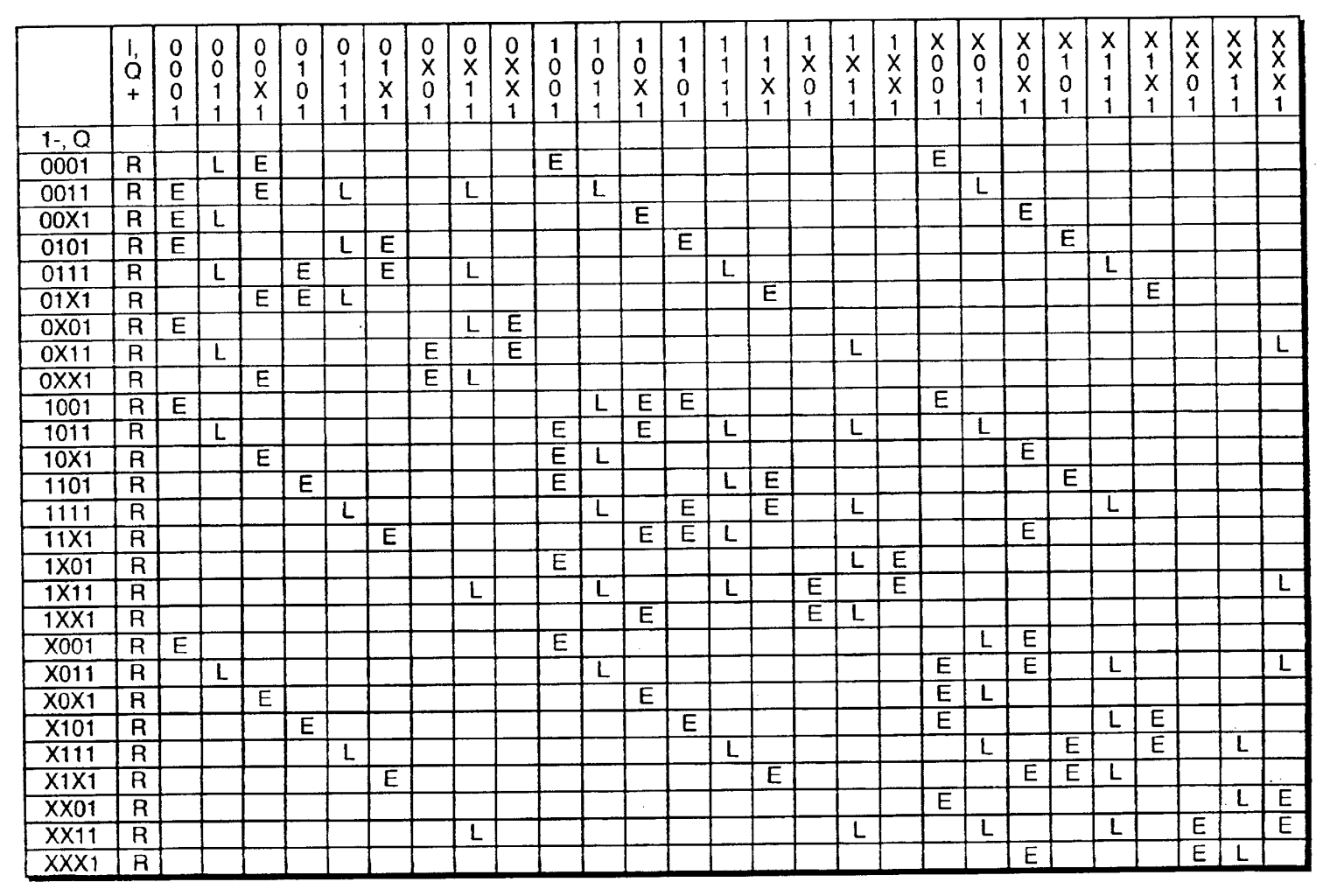

FIG. 6 illustrates one embodiment of a region of the conversion matrix of FIGS. 5A and 5B for the output state transition QQ+ of 11. The illustrated region corresponds to region D in FIG. 4. The region of the conversion matrix includes every possible state transition for which the output state does not change. The conversion matrix is further simplified by eliminating any state transitions involving an X input. That is, we are interested in finding combinational gates that when synthesized into a real circuit will provide the equivalent behavior. X values are useful in simulation but are not useful in the synthesis of a real circuit. Therefore, FIG. 7 shows the simplified conversion matrix region for the output state transition 11.

Each column in FIG. 7 is classified as level or edge, and reachable or unreachable. Recall that a level line in a UDP table corresponds to 2N entries in a given column for each single input bit transition to one of two states for a given output bit transition. For instance, the conversion table would include an entry in a given column for each input bit transition from 0 to 1 or 0 to X and each output bit transition. Since entries having an X input value are ignored in FIG. 7, and since FIG. 7 is limited to just one output bit transition of 11, a column in FIG. 7 would only include one entry for each input bit transition. Since N=3 input bits in the illustrated embodiment, a column can be classified as a level column if it includes three entries corresponding to each one bit transition on an input.

Taking column 0001 as an example, it has three entries at 0011, 0101, and 1001. Each of the entries corresponds to a one bit transition on one input bit, so column 0001 is a level column. Moreover, the state 0001is reachable. Therefore, column 0001 can be added to the L11 set. Similarly, columns 0011, 0111, 1001, 1011, 1101, and 1111 can be added to the L11 set because each includes three entries corresponding to one bit transitions on each of the inputs.

The column 0101, however, has fewer than three entries. Recall that an edge line in a UDP table corresponds to a single entry in the conversion matrix. Therefore, if a column in a simplified conversion matrix region like the one illustrated in FIG. 7 includes less than N entries corresponding to single input bit transitions, the column is classified as an edge column. Since state 0101 is reachable, the column 0101 can be added to the E11 set. Since the edge column includes two entries, each entry corresponds to a separate edge transition in the UDP. Both edge transitions from 1101 to 0101 and from 0111 to 0101 should be added to the set E11. In one embodiment, these edge transitions are written (10) 101 and 01(10)1.

If the same procedure is followed using similar, simplified conversion matrix regions for the other five output state transitions, the columns can be classified as follows:

E00: (01)100
E11: (10)101, 01(10)1
E01: 1(01)00
EUR01: 11(10)0
E10: 0(01)01
L00: 0000, 0100, 1000
L11: 0001, 0011, 0111, 1001, 1011, 1101, 1111
L01: 0010, 0110, 1010, 1110

The other sets are empty. If the sets E01 and E10 are empty, the UDP is a level sensitive device and the generic register 210 from FIG. 2 should be a latch. If the sets E01 and E10 are not empty, the UDP is an edge sensitive device and the generic register 210 from FIG. 2 should be a D Flip-Flop. In the illustrated embodiment, the UDP is edge sensitive.

For an edge sensitive device, the following functions can be used to recognize the clock signal and determine the combinational logic functions:

Fset=L01+DC[L11∪LUR01∪LUR11]
Frst=L10+DC[L00∪LUR10∪LUR00]
Fclen=single edge identified in E01 and E10
Ftmpa=E01*∪E11*∪L11*
Ftmpb=Ftmpa+DC[EUR01*∪EUR11*∪LUR11*]
Fd=Ftmpb+DC[Fset∪Frst], ignoring the single edge identified for the clock These functions represent one embodiment of logic minimization functions that can be used. Alternate embodiments may use different minimization functions.

In the illustrated functions, Fset is equal to a logic function that will produce a 1 for each of the columns in the L01 set. That is, the set function is coupled to the SET input on the D Flip-Flop. The set function will transition the output state of the D Flip-Flop from 0 to 1 whenever the output of the set function is 1. Based on the sets derived from the conversion matrix, the set function should output a 1 for every column in the L01 set to represent the behavior of the UDP. Furthermore, the set function is allowed to output a 1 for any column in the L11 set because the set function will not alter the behavior for those columns. That is, the output state is already at 1, so setting the D Flip-Flop will not have an impact on the behavior. Furthermore, the set function is allowed to be 1 for any unreachable transitions to an output state of 1 because unreachable states will never occur so the set function will never actually generate a 1 for those columns. Therefore, as shown in the Fset function, the function can be minimized by using "don't care" (DC) values for each of the columns of set L11, LUR01, and LUR11. The same basic approach applies to the Frst function, except that, the output state transition is to 0 rather than 1.

The Fclen function is the logic function for the clock input to the D Flip-Flop. In the illustrated set of functions, the clock signal is assumed to be a non-gated clock. That is, one of the inputs is assumed to be a clock signal, and the clock signal is applied directly to the register. Therefore, there is really no function to evaluate for the CLK input to the D Flip-Flop. Instead, the clock signal needs only to be recognized from the list of input signals. The clock signal is the input that is a rising edge for columns in both sets E01 and E10 for a positive (rising) edge triggered D Flip-Flop, or a falling edge for columns in both sets E01 and E10 for a negative (falling) edge triggered D Flip-Flop. For a negative edge triggered device, the clock function is simply an inverter.

Evaluating the illustrated data function, Fd, is a three step process. First, Ftmpa is evaluated. Ftmpa is the union of certain columns from sets E01, E11, and L11. The "*" next to each set indicates that some columns should be excluded from the sets prior to evaluating the function. Columns are excluded based on two criteria. First, columns are removed that are not "compatible" with the clock. An edge column is not compatible with the clock if it does not include the same edge (rising or falling) as the clock and for the same input previously identified as the clock input. A level column is not compatible if the input corresponding to the clock input is not 1 for a rising edge device or 0 for a falling edge device. Second, all columns used in the set or reset functions are eliminated.

In order to evaluate Boolean equations using edge columns, an edge column has to be re-written in a "level" representation. That is, an edge column should be evaluated using the end value of an edge transition. For instance, an edge column (01)001 should be re-written as 1001 for evaluation purposes.

After Ftmpa is evaluated, it is used to evaluate Ftmpb. In Ftmpb a number of unreachable columns are used as don't cares to simplify the logic. Finally, Ftmpb is used to evaluate Fd. The columns used in the set and reset functions are treated as don't cares and the input corresponding to the clock in each column is also treated as a don't care.

Applying the functions to the sets of columns identified for the UDP of FIG. 1, a number of sets are empty so the equations can be simplified to:

Fset=L01+DC[L11]
Frst=0
Fclen=single edge identified in E01 and E10
Ftmpa=E01*∪E11*∪L11*
Ftmpb=Ftmpa+DC[EUR01*]
Fd=Ftmpb+DC[Fset], ignoring the single edge identified for the clock FIG. 8 illustrates one embodiment of a Karnaugh map representing the set function, Fset. For each column in the set L01, a 1 is placed in the map. That is, for 0010, 0110, 1010, and 1110 a 1 is added to the map. For each column in the set L11, a don't care, DC, is added to the map. The logic function can be minimized by circling the largest block of ones and DCs. As can be seen in the map, the function is 1 or DC everywhere that SET is 1 and either 0 or DC everywhere that SET is 0. Therefore, the logic function can provide the correct functionality by coupling directly to the SET input.

The reset function, Frst, is empty so it can be coupled to zero. The clock function, Fclen, is coupled to the single input identified in the E01 and E10 sets. Both sets have a rising edge for the CLK input, so the logic function can provide the correct functionality by coupling directly to the CLK input.

Ftmpa includes certain columns from the sets E01, E11, and L11. The edge in the column 1(01)00 from set E01 is compatible with the clock signal so it is included. For purposes of evaluation, the column can be written 1100. Both edges from E11 do not have the same edge for the same CLK input, so both columns are excluded. For L11, only columns having a 1 for the CLK input are included, 0111, 1101, and 1111.

Ftmpb adds don't care values for columns in EUR01 that are compatible with the clock. The column in EUR01, however, is incompatible, so Ftmpb simply equals Ftmpa.

Figures 9, 10:
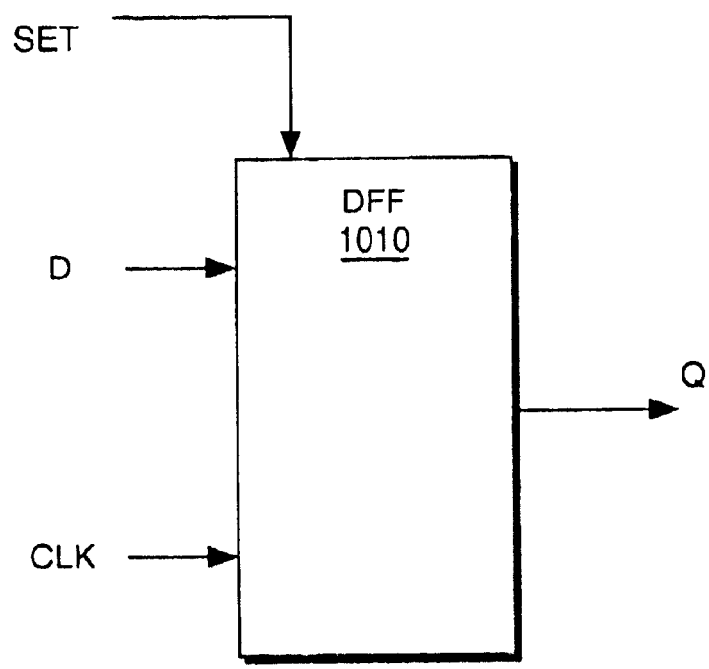
FIG. 9 illustrates a Karnaugh map for a particular data function, Fd.
FIG. 10 illustrates one embodiment of a circuit element synthesized in generic HDL primitives based on an HDL sequential truth table.

FIG. 9 illustrates a Karnaugh map for the data function, Fd. The input identified for the clock is ignored so there are only three values to consider. From Ftmpa, columns 1100, 0111, 1101, and 1111 were identified. After removing the clock 15, signal, these columns are 100, 011, 101, and 111.

Placing a 1 in the map for each column produces a more complicated map than the map for Fset because there is no clear block of 1s and DCs. However, columns that were used in the Fset function are. treated as DCs in Fd. Placing a DC in the map where Fset is 1 or DC simplifies the function. As shown in FIG. 9, everywhere that the D input is 1 the function is either 1 or DC, and everywhere that the D input is 0 the function is either 0 or DC. In which case, the Fd function can provide the correct functionality by connecting directly to the D input.

FIG. 10 illustrates the HDL primitives that provide the equivalent behavior of the UDP of FIG. 1.

Sorting the columns is different for a level sensitive device. The enable, set, and reset functions are all level sensitive, providing more flexibility in the formation of the logic functions. Various embodiments of functions are given below. In this first embodiment, the behavior of a level sensitive UDP can be equivalently modeled using a latch and logic functions on only the set and reset inputs of the latch.

Fset=L01+DC[L11]
Frst=L10+DC[L00]
Fclen=0
Fd=0

In this next embodiment of functions, the enable and data logic functions are used to model the UDP behavior.

Fset=0
Frst=0
Fclen=L01+DC[L11]∪L10+DC[L00]
Fd=L01+DC[L11 ]

Below is a third embodiment for determining primitives for a level sensitive UDP.

Fset=Signal identified with the method discussed below
Frst=Signal identified with the method discussed below
Ftmp1=L01+DC[L11∪LUR01∪LUR11]
Ftmp2=L10+DC[L00∪LUR10∪LUR00]
Fclen=[Ftmp1∪Ftmp2]+DC[Fset∪Frst]
Fd=Ftmp1 and using the invert of the function Fclen as Don't Care In this last embodiment, the set and reset inputs of the latch are connected directly to individual respective inputs. A set signal that is active high is identified directly from reachable states in the conversion matrix by finding a signal for which there is no state where the signal is one and the next output state Q+ is zero. That is, there can be no state in which set is active and the next output state is not set. A similar search can be done to identify a reset signal. The remaining functions are evaluated in much the same way as those described above for the edge triggered UDP.

Figure 11:
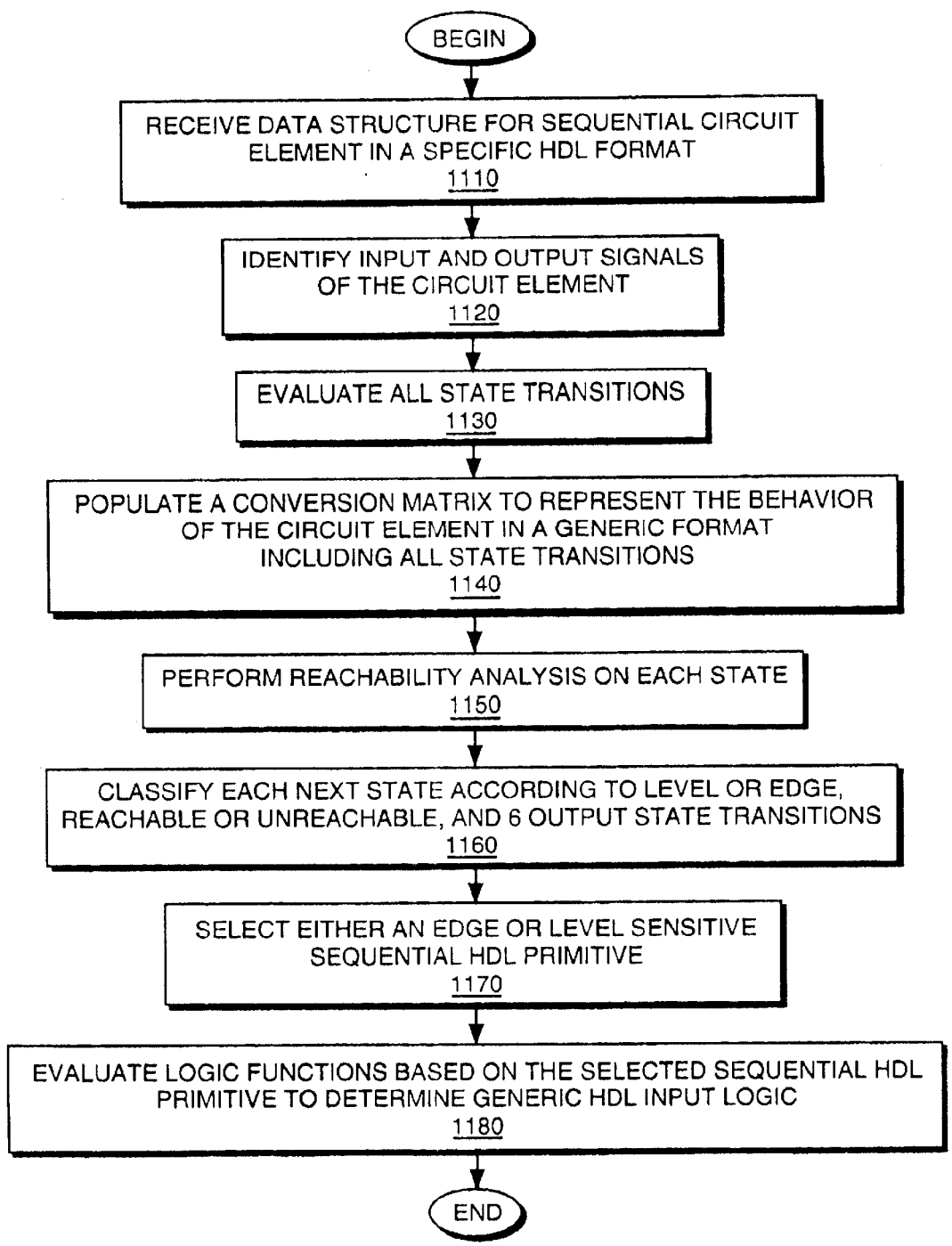
FIG. 11 demonstrates one embodiment of the present invention.

FIG. 11 demonstrates one embodiment of the present invention. As discussed above, in general, the present invention converts an HDL truth table from a specific format to an expanded conversion matrix in a generic format, and then condenses the expanded generic format down to a generic condensed format representing the behavior of the HDL truth table using a generic HDL register and generic combinational logic functions. The illustrated embodiment includes a number of implementation specific details. Alternate embodiments may not include all of the illustrated elements, may include additional elements, may perform elements in different orders, etc.

At block 1110, the process receives a data structure representing the behavior of a sequential circuit element written in a specific HDL format. As discussed above, the data structure may have come, for instance from a library of HDL elements from a particular integrated circuit fabricator based on a particular fabrication technology.

At block 1120, the process identifies input and output signals of the circuit element. For instance, in a Verilog UDP, there could be up to 10 inputs. At block 1130, the process evaluates all the state transitions for the circuit element. For instance, state transitions are evaluated for every possible variation of input and output combinations and transitions. At block 1140, the process populates a conversion matrix with the state transitions to represent the behavior of the circuit element in a generic format. At block 1150, the process performs a reachability analysis on each state. At block 1160, the process classifies each next state according level or edge states, according to reachable or unreachable states, and according to six output transitions. At block 1170, the process selects either a level or edge sensitive sequential HDL primitive and, at block 1180, evaluates logic functions corresponding to the inputs to the selected sequential HDL primitive to determine generic HDL input logic.

Figure 12:
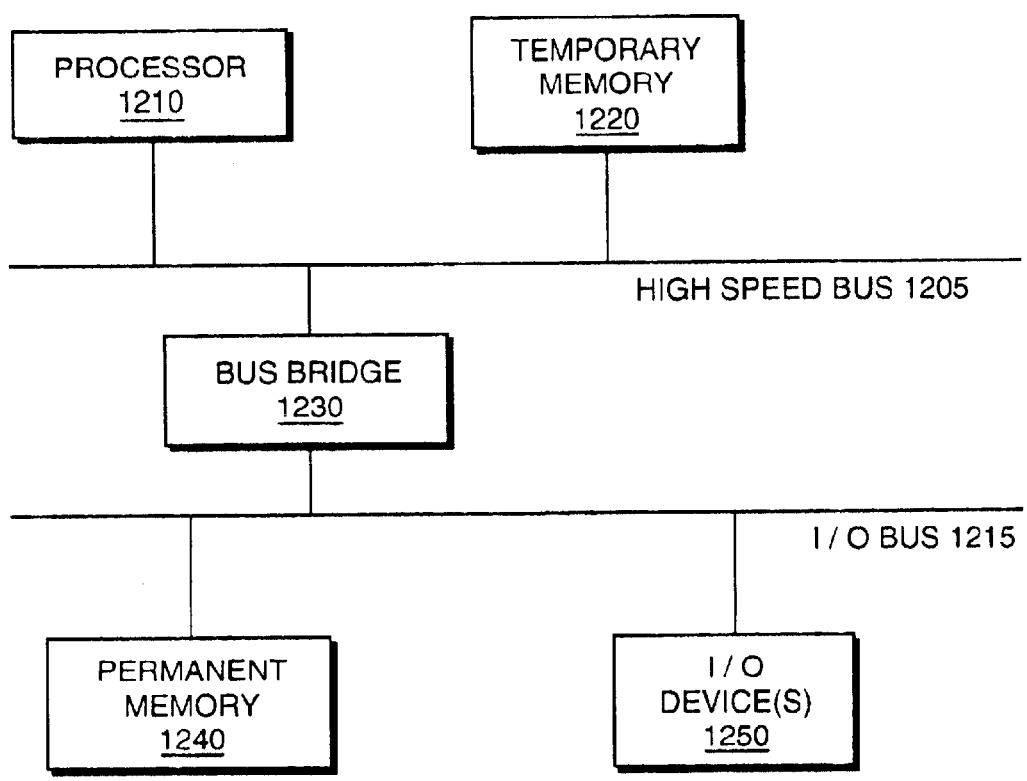
FIG. 12 illustrates one embodiment of a hardware system.

FIG. 12 illustrates one embodiment of a hardware system intended to represent a broad category of computer systems such as personal computers, workstations, and/or embedded systems. In the illustrated embodiment, the hardware system includes processor 1210 coupled to high speed bus 1205, which is coupled to input/output (I/O) bus 1215 through bus bridge 1230. Temporary memory 1220 is coupled to bus 1205. Permanent memory 1240 is coupled to bus 1215. I/O device(s) 1250 is also coupled to bus 1215. I/O device(s) 1250 may include a display device, a keyboard, one or more external network interfaces, etc.

Certain embodiments may include additional components, may not require all of the above components, or may combine one or more components. For instance, temporary memory 1220 may be on-chip with processor 1210. Alternately, permanent memory 1240 may be eliminated and temporary memory 1220 may be replaced with an electrically erasable programmable read only memory (EEPROM), wherein software routines are executed in place from the EEPROM. Some implementations may employ a single bus, to which all of the components are coupled, or one or more additional buses and bus bridges to which various additional components can be coupled. Those skilled in the art will be familiar with a variety of alternate internal networks including, for instance, an internal network based on a high speed system bus with a memory controller hub and an I/O controller hub. Additional components may include additional processors, a CD ROM drive, additional memories, and other peripheral components known in the art.

In one embodiment, the present invention, as described above, is implemented using one or more hardware systems such as the hardware system of FIG. 12. Where more than one computer is used, the systems can be coupled to communicate over an external network, such as a local area network (LAN), an internet protocol (IP) network, etc. In one embodiment, the present invention is implemented as software routines executed by one or more execution units within the computer(s). For a given computer, the software routines can be stored on a storage device, such as permanent memory 1240.

Figure 13:
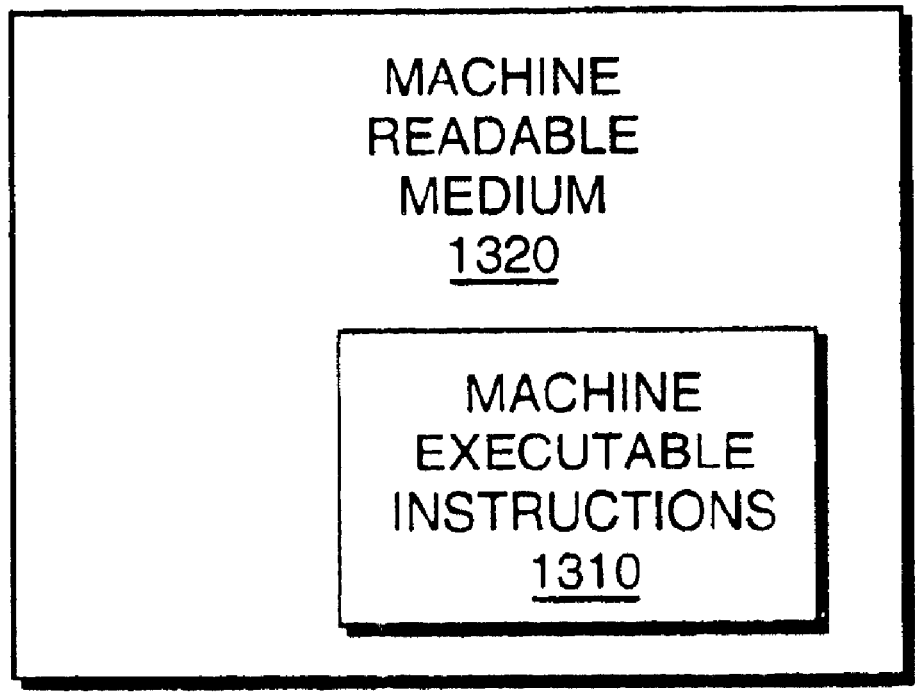
FIG. 13 illustrates one embodiment of a machine readable storage medium.

Alternately, as shown in FIG. 13, the software routines can be machine executable instructions 1310 stored using any machine readable storage medium 1320, such as a diskette, CD-ROM, magnetic tape, digital video or versatile disk (DVD), laser disk, ROM, Flash memory, etc. The series of instructions need not be stored locally, and could be received from a remote storage device, such as a server on a network, a CD ROM device, a floppy disk, etc., through, for instance, I/O device(s) 1250 of FIG. 12.

From whatever source, the instructions may be copied from the storage device into temporary memory 1220 and then accessed and executed by processor 1210. In one implementation, these software routines are written in the C programming language. It is to be appreciated, however, that these routines may be implemented in any of a wide variety of programming languages.

In alternate embodiments, the present invention is implemented in discrete hardware or firmware. For example, one or more application specific integrated circuits (ASICs) could be programmed with one or more of the above described functions of the present invention. In another example, one or more functions of the present invention could be implemented in one or more ASICs on additional circuit boards and the circuit boards could be inserted into the computer(s) described above. In another example, field programmable gate arrays (FPGAs) or static programmable gate arrays (SPGA) could be used to implement one or more functions of the present invention. In yet another example, a combination of hardware and software could be used to implement one or more functions of the present invention.

Thus, a method and apparatus for converting an HDL truth table to generic HDL elements is described. Whereas many alterations and modifications of the present invention will be comprehended by a person skilled in the art after having read the foregoing description, it is to be understood that the particular embodiments shown and described by way of illustration are in no way intended to be considered limiting. Therefore, referenced to details of particular embodiments are not intended to limit the scope of the claims.

What is claimed is:

1. A method for converting a data structure from a specific format in a hardware description language (HDL) to generic HDL elements, the method comprising:
  receiving the data structure representing a behavior of a circuit element, said circuit element being sequential and said data structure being defined using the specific format;
  generating an expanded conversion matrix from the data structure,
  condensing the expanded conversion matrix to a condensed conversion matrix in a condensed generic format, said condensed conversion matrix to represent the behavior of the circuit element in a generic format; and
  determining a generic HDL register and a plurality of generic HDL input logic for the generic HDL register to replicate the behavior represented by the data structure based on the condensed conversion matrix.

2. The method of claim 1 whereby the condensing further comprises using a Karnaugh map.

3. The method of claim 1 wherein determining provides identical generic HDL registers for data structures with different representations but identical functionality.

4. A method for converting a data structure from a specific format in a hardware description language, (HDL) to generic HDL elements, the method comprising:
  receiving the data structure representing a behavior of a circuit element, said circuit element being sequential and said data structure being defined using the specific format;
  generating a conversion matrix from the data structure, said conversion matrix to represent the behavior of the circuit element in a generic format;
  determining a generic HDL register and a plurality of generic HDL input logic for the generic HDL register to replicate the behavior represented by the data structure based on the conversion matrix; and
  wherein the HDL is Verilog, the data structure is a user defined primitive (UDP), and the generic HDL register and the generic HDL input logic consist entirely of Verilog primitives.

5. A method for converting a data structure from a specific format in a hardware description language (HDL) to generic HDL elements, the method comprising:
  receiving the data structure representing a behavior of a circuit element, said circuit element being sequential and said data structure being defined using the specific format;
  generating a conversion matrix from the data structure, said conversion matrix to represent the behavior of the circuit element in a generic format;
  determining a generic HDL register and a plurality of generic HDL input logic for the generic HDL register to replicate the behavior represented by the data structure based on the conversion matrix; and
  wherein the specific format comprises a technology-specific format used to create a library of elements from which the circuit element is received.

6. A method for converting a data structure from a specific format in a hardware description language (HDL) to generic HDL elements, the method comprising:
  receiving the data structure representing a behavior of a circuit element, said circuit element being sequential and said data structure being defined using the specific format;
  generating a conversion matrix from the data structure, said conversion matrix to represent the behavior of the circuit element in a generic format; and
  determining a generic HDL register and a plurality of generic HDL input logic for the generic HDL register to replicate the behavior represented by the data structure based on the conversion matrix,
  wherein the conversion matrix comprises a plurality of entries representing every state of the circuit element and every corresponding next state of the circuit element.

7. A method for converting a data structure from a specific format in a hardware description language (HDL) to generic HDL elements, the method comprising:
  receiving the data structure representing a behavior of a circuit element, said circuit element being sequential and said data structure being defined using the specific format;
  generating a conversion matrix from the data structure, said conversion matrix to represent the behavior of the circuit element in a generic format;
  determining a generic HDL register and a plurality of generic HDL input logic for the generic HDL register to replicate the behavior represented by the data structure based on the conversion matrix; and
  wherein generating the conversion matrix comprises:
  performing a reachability analysis on the conversion matrix to classify whether each particular state of the circuit element defined by the conversion matrix is reachable.

8. A method for converting a data structure from a specific format in a hardware description language (HDL) to generic HDL elements, the method comprising:
  receiving the data structure representing a behavior of a circuit element, said circuit element being sequential and said data structure being defined using the specific format;

generating a conversion matrix from the data structure, said conversion matrix to represent the behavior of the circuit element in a generic format; and determining a generic HDL register and a plurality of generic HDL input logic for the generic HDL register to replicate the behavior represented by the data structure based on the conversion matrix, wherein generating the conversion matrix comprises:

identifying input signals and an output signal of the circuit element from the data structure;

evaluating state transitions for the circuit element by evaluating the data structure for a next output signal for each transition of the input signals and for each current output signal; and populating entries of the conversion matrix for each state transition.

9. A method for converting a data structure from a specific format in a hardware description language (HDL) to generic HDL elements, the method comprising:

receiving the data structure representing a behavior of a circuit element, said circuit element being sequential and said data structure being defined using the specific format;

generating a conversion matrix from the data structure, said conversion matrix to represent the behavior of the circuit element in a generic format; and determining a generic HDL register and a plurality of generic HDL input logic for the generic HDL register to replicate the behavior represented by the data structure based on the conversion matrix;

wherein generating the conversion matrix comprises:

identifying input signals and an output signal of the circuit element from the data structure;

evaluating state transitions for the circuit element by evaluating the data structure for a next output signal for each transition of the input signals and for each current output signal; and populating entries of the conversion matrix for each state transition; and wherein states for the input signals and states for the output signals comprise 0, 1, and X.

10. A method for converting a data structure from a specific format in a hardware description language (HDL) to generic HDL elements, the method comprising:

receiving the data structure representing a behavior of a circuit element, said circuit element being sequential and said data structure being defined using the specific format;

generating a conversion matrix from the data structure, said conversion matrix to represent the behavior of the circuit element in a generic format;

determining a generic HDL register and a plurality of generic HDL input logic for the generic HDL register to replicate the behavior represented by the data structure based on the conversion matrix;

wherein the conversion matrix is organized into a plurality of current states of the circuit element and corresponding next states of the circuit element, and wherein determining the generic HDL register and the plurality of generic HDL input logic comprises:

classifying each next state of the conversion matrix into one of a plurality of sets of states based on predefined criteria;

selecting either an edge sensitive HDL primitive or a level sensitive HDL primitive for the generic HDL register based on selected ones of the plurality of sets of states;

selecting a particular set of functions based on the generic HDL register selected, each function of the particular set of functions corresponding to an input to the generic HDL register; and evaluating the particular set of functions to determine the plurality of generic HDL input logic.

11. The method of claim 10 wherein each next state is classified into one of a plurality of sets of states according to level (L) or edge (E) sensitive states, according to reachable or unreachable (UR) states, and according to output state transitions of the circuit element, wherein the output state transitions comprise six categories of output state transitions included within the following parentheses (00, 01, 0X, 10, 11, 1X), such that the plurality of sets of states comprises 24 sets of states, and wherein the 24 sets of states comprise sets included within the following parentheses (L00, L01, L0X, L10, L11, L1X, E00, E01, E0X, E10, E11, E1X, LUR00, LUR01, LUR0X, LUR10, LUR11, LUR1X, EUR00, EUR01, EUR 0X, EUR10, EUR11, EUR1X).

12. The method of claim 11 wherein each current state comprises N current input values, wherein N is a variable and corresponds to a quantity of input values, and a current output value Q, wherein each current state is classified as reachable or unreachable, wherein each next state comprises N next input values and a next output value Q+, wherein each of the N current input values, each of the N next input values, the current output value Q, and the next output value Q+ comprise one of 0, 1, and X, and wherein classifying each next state comprises:

selecting a particular next state having a particular output value Q+;

identifying any current states corresponding to the particular next state in the conversion matrix to provide identified current states;

ignoring any of the identified current states that have a current input value of X to provide a set of remaining current states;

organizing the remaining current states by their respective output values Q;

classifying the particular next state as a level sensitive state (L) for one or more of the said six categories of output state transitions for any value of Q for which N of the remaining current states have a same value Q;

classifying the particular next state as an edge sensitive state (E) for one or more of the said six categories of output state transitions for any value of Q for which less than N of the remaining current states have a same value Q; and classifying the particular next state as unreachable (UR) for one or more of the said six categories of output state transitions for any value of Q for which all of the remaining current states are classified as unreachable.

13. The method of claim 11 wherein selecting either the edge sensitive HDL primitive or the level sensitive HDL primitive comprises:

selecting the level sensitive HDL primitive if sets E01 and E10 are empty.

14. The method of claim 11 wherein the particular set of functions for the edge sensitive HDL primitive comprises:

function Fset=set L01 with do not care values for states which are a union of sets L11, LUR01, and LUR11;

function Frst=set L10 with do not care values for states which are a union of sets L00, LUR10, and LUR00;

function Fclen=a single common input identified in sets E01 and E10;

function Ftmpa=selected next states from a union of sets E01, E11, and L11;

function Ftmpb=function Ftmpa with do not care values for states which are selected next states from a union of sets EUR01, EUR11, and LUR11; and function Fd=function Ftmpb with do not care values for states which are a union of function Fset and function Frst, wherein the single common input identified for function Fclen is ignored, and wherein the selected next states are edge states having a same edge transition as the single common input identified for function Fclen.

15. The method of claim 11 wherein the particular set of functions for the level sensitive HDL primitive comprises:

function Fset=set L01 with do not care values for the states of set L11;

function Frst=set L10 with do not care values for the states of set L00;

function Fclen=0; and function Fd=0.

16. The method of claim 11 wherein the particular set of functions for the level sensitive HDL primitive comprises:

function Fset=0;

function Frst=0;

function Fclen=(set L01 with do not care values for the states of set L11) union with (set L10 with do not care values for the states of set L00); and function Fd=set L01 with do not care values for the states of set L11.

17. The method of claim 11 wherein the particular set of functions for the level sensitive HDL primitive comprises:

function Fset=a single input identified from the conversion matrix for which there is no current state for which the output Q+ of the corresponding next state is zero;

function Frst=a single input identified from the conversion matrix for which there is no current state for which the output Q+ of the corresponding next state is one;

function Ftmp1=set L01 with do not care values for states which are a union of sets L11, LUR01, and LUR11;

function Ftmp2=set L10 with do not care values for states which are a union of sets L00, LUR10, and LUR00;

function Fclen=a union of function Ftmp1 and function Ftmp2 with do not care values for a union of function Fset and function Frst; and function Fd=function Ftmp1 with do not care values for states which are an inverted function Fclen.

18. The method of claim 10 wherein each next state is classified as level (L) or edge (E) sensitive.

19. The method of claim 10, wherein each next state is classified as reachable (R) or unreachable (U).

20. The method of claim 10, wherein output state transitions of the circuit element comprise the output state transitions set forth within the following parentheses (00, 01, 0X, 10, 11, 1X, X0, X1, XX) and wherein each next state is classified using at least six of the output state transitions set forth within the following parentheses (00, 01, 0X, 10, 11, 1X, X0, X1, XX).

21. The method of claim 10, wherein output state transitions of the circuit element comprise the output state transitions set forth within the following parentheses (00, 01, 0X, 10, 11, 1X, X0, X1, XX) and wherein each next state classification does not include at least one of the output state transitions set forth in the following parentheses (X0, X1, XX).

22. A machine readable medium having stored thereon machine executable instructions to implement a method for converting a data structure from a specific format in a hardware description language (HDL) to generic HDL elements, the method comprising:

receiving the data structure representing a behavior of a circuit element, said circuit element being sequential and said data structure being defined using the specific format;

generating a conversion matrix from the data structure, said conversion matrix to represent the behavior of the circuit element in a generic format; and determining a generic HDL register and a plurality of generic HDL input logic comprising combinational gates for the generic HDL register to replicate the behavior represented by the data structure based on the conversion matrix.

23. The machine readable medium of claim 22 wherein generating the conversion matrix comprises:

identifying input signals and an output signal of the circuit element from the data structure;

evaluating state transitions for the circuit element by evaluating the data structure for a next output signal for each transition of the input signals and for each current output signal; and populating entries of the conversion matrix for each state transition.

24. The machine readable medium of claim 22 wherein the particular set of functions for the level sensitive hardware description language (HDL) primitive comprises:

function Fset=a single input identified from the conversion matrix for which there is no current state for which the output Q+ of the corresponding next state is zero;

function Frst=a single input identified from the conversion matrix for which there is no current state for which the output Q+ of the corresponding next state is one;

function Ftmp1=set L01 with do not care values for states which are a union of sets L11, LUR01, and LUR11;

function Ftmp2=set L10 with do not care values for states which are a union of sets L00, LUR10, and LUR00;

function Fclen=a union of function Ftmp1 and function Ftmp2 with do not care values for states which are a union of function Fset and function Frst; and function Fd=function Ftmp1 with do not care values for states which are an inverted function Fclen.

25. The machine readable medium of claim 22, further comprising evaluating the conversion matrix, wherein the conversion matrix comprises conversion matrix columns, whereby evaluating comprises classifying a conversion matrix column into a category, the category comprising an edge state, a level state, a reachable state, or an unreachable state.

26. The machine readable medium of claim 25, where evaluating further comprises classifying the conversion matrix column as an output state transition.

27. The machine readable medium of claim 26, wherein output state transitions of the circuit element are represented by QQ+ and wherein the output state transition QQ+ comprises one of QQ+=00, QQ+=01, QQ+=0X, QQ+=10, QQ+=11, or QQ+=1X.

28. The machine readable medium of claim 22, wherein the conversion matrix comprises a plurality of entries representing every state of the circuit element.

29. The machine readable medium of claim 28, wherein the circuit element has reachable states and wherein the plurality of entries representing every state of the circuit element further comprise every next reachable state of the circuit element.

30. A machine readable medium having stored thereon machine executable instructions to implement a method comprising:
    receiving a data structure representing a behavior of a circuit element, said circuit element being sequential and said data structure being defined in a hardware description language (HDL) using a specific format;
    generating a conversion matrix from the data structure, said conversion matrix to represent the behavior of the circuit element in a generic format;
    determining a generic HDL register and a plurality of generic HDL input logic for the generic HDL register to replicate the behavior represented by the data structure based on the conversion matrix; and
    wherein the HDL is Verilog, the data structure is a user defined primitive (UDP), and the generic HDL input logic consists entirely of Verilog primitives.

31. A machine readable medium having stored thereon machine executable instructions to implement a method comprising:
    receiving a data structure representing a behavior of a circuit element, said circuit element being sequential and said data structure being defined in a hardware description language (HDL) using a specific format;
    generating a conversion matrix from the data structure, said conversion matrix to represent the behavior of the circuit element in a generic format;
    determining a generic HDL register and a plurality of generic HDL input logic for the generic HDL register to replicate the behavior represented by the data structure based on the conversion matrix; and
    wherein the specific format comprises a technology-specific format used to create a library of elements from which the circuit element is received.

32. A machine readable medium having stored thereon machine executable instructions to implement a method for converting a data structure from a specific format in a hardware description language (HDL) to generic HDL elements, the method comprising:
    receiving the data structure representing a behavior of a circuit element, said circuit element being sequential and said data structure being defined using the specific format;
    generating a conversion matrix from the data structure, said conversion matrix to represent the behavior of the circuit element in a generic format; and
    determining a generic HDL register and a plurality of generic HDL input logic for the generic HDL register to replicate the behavior represented by the data structure based on the conversion matrix wherein the conversion matrix comprises a plurality of entries representing every state of the circuit element and every corresponding next state of the circuit element.

33. A machine readable medium having stored thereon machine executable instructions to implement a method comprising:
    receiving a data structure representing a behavior of a circuit element, said circuit element being sequential and said data structure being defined in a hardware description language (HDL) using a specific format;
    generating a conversion matrix from the data structure, said conversion matrix to represent the behavior of the circuit element in a generic format;
    determining a generic HDL register and a plurality of generic HDL input logic for the generic HDL register to replicate the behavior represented by the data structure based on the conversion matrix; and
    wherein generating the conversion matrix comprises performing a reachability analysis on the conversion matrix to classify whether each particular state of the circuit element defined by the conversion matrix is reachable.

34. A machine readable medium having stored thereon machine executable instructions to implement a method for converting a data structure from a specific format in a hardware description language (HDL) to generic HDL elements, the method comprising:
    receiving the data structure representing a behavior of a circuit element, said circuit element being sequential and said data structure being defined using the specific format;
    generating a conversion matrix from the data structure, said conversion matrix to represent the behavior of the circuit element in a generic format;
    determining a generic HDL register and a plurality of generic HDL input logic for the generic HDL, register to replicate the behavior represented by the data structure based on the conversion matrix;
    wherein generating the conversion matrix comprises:
    identifying input signals and an output signal of the circuit element from the data structure;
    evaluating state transitions for the circuit element by evaluating the data structure for a next output signal for each transition of the input signals and for each current output signal; and
    populating entries of the conversion matrix for each state transition; and
    wherein states for the input signals and states for the output signals comprise 0, 1, and X.

35. A machine readable medium having stored thereon machine executable instructions to implement a method for converting a data structure from a specific format in a hardware description language (HDL) to generic HDL elements, the method comprising:
    receiving the data structure representing a behavior of a circuit element, said circuit element being sequential and said data structure being defined using the specific format;
    generating a conversion matrix from the data structure, said conversion matrix to represent the behavior of the circuit element in a generic format;
    determining a generic HDL register and a plurality of generic HDL input logic for the generic HDL register to replicate the behavior represented by the data structure based on the conversion matrix;
    wherein the conversion matrix is organized into a plurality of current states of the circuit element and corresponding next states of the circuit element, and wherein determining the generic HDL register and the plurality of generic HDL input logic comprises:
    classifying each next state of the conversion matrix into one of a plurality of sets of states based on predefined criteria;
    selecting either an edge sensitive HDL primitive or a level sensitive HDL primitive for the generic HDL register based on selected ones of the plurality of sets of states;
    selecting a particular set of functions based on the generic HDL register selected, each function of the particular set of functions corresponding to an input to the generic HDL register; and evaluating the particular set of functions to determine the plurality of generic HDL input logic.

36. The machine readable medium of claim 35 wherein each next state is classified into one of a plurality of sets of states according to level (L) or edge (E) sensitive states, according to reachable or unreachable (UR) states, and according to output state transitions of the circuit element, wherein the output state transitions comprise six categories of output state transitions included within the following parentheses (00, 01, 0X, 10, 11, 1X), such that the plurality of sets of states comprises 24 sets of states, and wherein the 24 sets of states comprise sets included within the following parentheses (L00, L01, L0X, L10, L11, L1X, E00, E01, E0X, E10, E11, E1X , LUR00, LUR01, LUR0X, LUR10, LUR11, LUR1X, EUR00, EUR01, EUR 0X, EUR10, EUR11, EUR1X).

37. The machine readable medium of claim 36 wherein each current state comprises N current input values, wherein N is a variable and corresponds to a quantity of input values, and a current output value Q, wherein each current state is classified as reachable or unreachable, wherein each next state comprises N next input values and a next output value Q+, wherein each of the N current input values, each of the N next input values, the current output value Q, and the next output value Q+ comprise one of 0, 1, and X, and wherein classifying each next state comprises:

selecting a particular next state having a particular output value Q+;

identifying any current states corresponding to the particular next state in the conversion matrix to provide identified current states;

ignoring any of the identified current states that have a current input value of X to provide a set of remaining current states;

organizing the remaining current states by their respective output values Q;

classifying the particular next state as a level sensitive state (L) for one or more of the said six categories of output state transitions for any value of Q for which N of the remaining current states have a same value Q;

classifying the particular next state as an edge sensitive state (E) for one or more of the said six categories of output state transitions for any value of Q for which less than N of the remaining current states have a same value Q; and classifying the particular next state as unreachable (UR) for one or more of the said six categories of output state transitions for any value of Q for which all of the remaining current states are classified as unreachable.

38. The machine readable medium of claim 36 wherein selecting either the edge sensitive HDL primitive or the level sensitive HDL primitive comprises:

selecting the level sensitive HDL primitive if sets E01 and E10 are empty.

39. The machine readable medium of claim 36 wherein the particular set of functions for the edge sensitive HDL primitive comprises:

function Fset=set L01 with do not care values for states which are a union of sets L11, LUR01, and LUR11;

function Frst=set L10 with do not care values for states which are a union of sets L00, LUR10, and LUR00;

function Fclen=a single common input identified in sets E01 and E10;

function Ftmpa=selected next states from a union of sets E01, E11, and L11;

function Ftmpb=function Ftmpa with do not care values for states which are selected next states from a union of sets EUR01, EUR11, and LUR11; and function Fd=function Ftmpb with do not care values for states which are a union of function Fset and function Frst, wherein the single common input identified for function Fclen is ignored, and wherein the selected next states are edge states having a same edge transition as the single common input identified for function Fclen.

40. The machine readable medium of claim 36 wherein the particular set of functions for the level sensitive HDL primitive comprises:

function Fset=set L01 with do not care values for the states of set L11;

function Frst=set L10 with do not care values for the states of set L00;

function Fclen=0; and function Fd 0.

41. The machine readable medium of claim 36 wherein the particular set of functions for the level sensitive HDL primitive comprises:

function Fset=0;

function Frst=0;

function Fclen=(set L01 with do not care values for the states of set L11) union with (set L10 with do not care values for the states of set L00); and function Fd=set L01 with do not care values for the states of set L11.

42. An apparatus for converting a data structure from a specific format in a hardware description language (HDL) to generic HDL elements, the apparatus comprising:

a processor; and a machine readable storage medium storing thereon machine executable instructions, the processor to execute the machine executable instructions to receive the data structure representing a behavior of a circuit element, said circuit element being sequential and said data structure being defined using the specific format;

generate a conversion matrix from the data structure, said conversion matrix to represent the data structure in a first compressed format;

convert the conversion matrix into a second condensed format, said condensed conversion matrix to represent the behavior of the circuit element in a generic format; and determine a generic HDL register and a plurality of generic HDL input logic for the generic HDL register to replicate the behavior represented by the data structure based on the conversion matrix.

43. The apparatus of claim 42, wherein the data structure comprises first and second user defined primitives (UDPs) in a first condensed format which have different representations in the first condensed format but identical functionality, the conversion matrix representing the first and second user defined primitives in the first compressed format and wherein the first and second primitives represented by the conversion matrix are given identical representations in the second condensed format.

* * * * *

UNITED STATES PATENT AND TRADEMARK OFFICE
CERTIFICATE OF CORRECTION

| | | |
|---|---|---|
| PATENT NO. | : 6,874,134 B1 | Page 1 of 1 |
| APPLICATION NO. | : 09/731535 | |
| DATED | : March 29, 2005 | |
| INVENTOR(S) | : Collin et al. | |

It is certified that error appears in the above-identified patent and that said Letters Patent is hereby corrected as shown below:

Column 5, line 20, "generic HOL" should be --generic HDL--.

Column 8, line 47, "the state 0001is" should be --the state 0001 is--.

Column 10, line 67, "clock 15, signal" should be --clock 15 signal--.

Column 16, line 19, "EUR 0X" should be --EUR0X--.

Column 20, line 22, "for the generic HDL," should be --for the generic HDL--.

Column 22, line 21, "function Fd 0." should be --function Fd=0.--.

Signed and Sealed this

Twenty-fourth Day of July, 2007

JON W. DUDAS
*Director of the United States Patent and Trademark Office*